United States Patent
Akiyama et al.

(10) Patent No.: US 9,312,160 B2
(45) Date of Patent: Apr. 12, 2016

(54) WAFER SUCTION METHOD, WAFER SUCTION STAGE, AND WAFER SUCTION SYSTEM

(75) Inventors: Hajime Akiyama, Tokyo (JP); Akira Okada, Tokyo (JP); Kinya Yamashita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 420 days.

(21) Appl. No.: 13/617,354

(22) Filed: Sep. 14, 2012

(65) Prior Publication Data

US 2013/0256964 A1 Oct. 3, 2013

(30) Foreign Application Priority Data

Mar. 27, 2012 (JP) .................... 2012-071988

(51) Int. Cl.
| | |
|---|---|
| *B25B 11/00* | (2006.01) |
| *H01L 21/677* | (2006.01) |
| *H01L 21/683* | (2006.01) |
| *H01L 21/687* | (2006.01) |

(52) U.S. Cl.
CPC ...... *H01L 21/67748* (2013.01); *H01L 21/6838* (2013.01); *H01L 21/68707* (2013.01); *Y10T 29/49998* (2015.01)

(58) Field of Classification Search
USPC .......................................................... 269/21
See application file for complete search history.

(56) References Cited

U.S. PATENT DOCUMENTS

| | | | | |
|---|---|---|---|---|
| 5,191,218 A | * | 3/1993 | Mori | G03F 7/707 250/453.11 |
| 5,564,682 A | * | 10/1996 | Tsuji | B25B 11/005 269/21 |
| 5,733,083 A | * | 3/1998 | Heminger | F16B 23/0069 405/259.6 |
| 6,173,648 B1 | * | 1/2001 | Misono | B25B 11/005 101/474 |
| 6,272,989 B1 | * | 8/2001 | Misono et al. | 101/474 |

(Continued)

FOREIGN PATENT DOCUMENTS

| | | |
|---|---|---|
| JP | H04-35827 A | 2/1992 |
| JP | 2003-086566 A | 3/2003 |

(Continued)

OTHER PUBLICATIONS

The first Office Action issued by the Chinese Patent Office on Jun. 3, 2015, which corresponds to Chinese Patent Application No. 201210434807.7 and is related to U.S. Appl. No. 13/617,354; with English language partial translation.

(Continued)

*Primary Examiner* — Lee D Wilson
*Assistant Examiner* — Alvin Grant
(74) *Attorney, Agent, or Firm* — Studebaker & Brackett PC

(57) ABSTRACT

A method of attaching a wafer by suction, includes a step of mounting a wafer on a right arm and a left arm of a transfer jig, moving the transfer jig toward a wafer suction stage in such a manner that a facing right arm surface of the right arm slides along and in contact with a first side surface of the wafer suction stage and a facing left arm surface of the left arm slides along and in contact with a second side surface of the wafer suction stage until the wafer comes to lie directly above a mounting surface of the wafer suction stage, mounting the wafer on the mounting surface by moving the transfer jig downward toward the wafer suction stage while maintaining the contacts, and attaching the wafer to the mounting surface by suction.

9 Claims, 8 Drawing Sheets

(56) References Cited

U.S. PATENT DOCUMENTS

| | | | | |
|---|---|---|---|---|
| 6,280,308 | B1 * | 8/2001 | Ishikawa | H01L 21/6838 451/289 |
| 6,585,471 | B2 * | 7/2003 | Odajima | H01L 21/67132 156/701 |
| 6,597,432 | B2 * | 7/2003 | Ida | G03B 27/60 269/21 |
| 7,145,254 | B2 * | 12/2006 | Hirano | H01L 21/565 257/706 |
| 8,138,456 | B2 * | 3/2012 | Fukuda | H01L 21/67005 118/725 |
| 8,336,188 | B2 * | 12/2012 | Monteen | H01L 21/6838 269/21 |
| 8,486,827 | B2 * | 7/2013 | Yoo | H01L 21/68721 219/76.1 |
| 2003/0001103 | A1 * | 1/2003 | Kobayashi | B25B 11/005 250/440.11 |
| 2003/0217460 | A1 | 11/2003 | Nishiura | |
| 2004/0036850 | A1 * | 2/2004 | Tsukamoto | G03F 7/707 355/72 |
| 2005/0170555 | A1 * | 8/2005 | Hirano | H01L 21/76838 438/106 |
| 2005/0227438 | A1 * | 10/2005 | Okabe | H01L 21/28 438/268 |
| 2006/0203222 | A1 * | 9/2006 | Ohmiya | B23K 26/4075 355/72 |
| 2008/0006856 | A1 | 1/2008 | Kobayashi et al. | |
| 2009/0026676 | A1 * | 1/2009 | Kurita | H01L 21/6838 269/21 |
| 2012/0034776 | A1 * | 2/2012 | Yoo | H01L 21/68721 438/660 |

FOREIGN PATENT DOCUMENTS

| | | |
|---|---|---|
| JP | 2003-347335 A | 12/2003 |
| JP | 2005-72039 A | 3/2005 |
| JP | 2008-4739 A | 1/2008 |
| JP | 2009-246199 A | 10/2009 |
| JP | 2011-49337 A | 3/2011 |

OTHER PUBLICATIONS

An Office Action; "Notification of Reason for Rejection," issued by the Japanese Patent Office on Jul. 28, 2015, which corresponds to Japanese Patent Application No. 2012-071988 and is related to U.S. Appl. No. 13/617,354; with English language translation.

An Office Action; "Notification of Reason for Rejection," issued by the Japanese Patent Office on Feb. 10, 2015, which corresponds to Japanese Patent Application No. 2012-071988 and is related to U.S. Appl. No. 13/617,354; with English language partial translation.

* cited by examiner

WAFER SUCTION METHOD, WAFER SUCTION STAGE, AND WAFER SUCTION SYSTEM

BACKGROUND OF THE INVENTION

1. Field of the Invention

The present invention relates to a wafer suction method, a wafer suction stage, and a wafer suction system used, e.g., when measuring the electrical characteristics of a wafer.

2. Background Art

Japanese Laid-Open Patent Publication No. 2003-347335 discloses a method wherein a porous metal section is provided in the surface of a stage and a wafer is mounted on this porous metal section. The lower surface of the porous metal portion adjoins a hollow space in the stage. Air is evacuated from this hollow space so that the wafer is attached to the upper surface of the porous metal section by suction.

Japanese Laid-Open Patent Publication No. 2008-4739 discloses a method wherein the electrical characteristics of a wafer are measured using the stage as an electrode. Japanese Laid-Open Patent Publication No. 2011-49337 discloses a method wherein a conductive sheet is formed on the bottom electrode of a wafer so as to prevent the bottom electrode of the wafer from being damaged by foreign matter, etc. caught between the bottom electrode and the stage.

The technique disclosed in the above-cited Publication No. 2003-347335 is disadvantageous in that portions of the porous metal section through which air is evacuated at a higher rate by the evacuation pump apply a higher suction pressure to the wafer than portions of the porous metal section through which air is evacuated at a lower rate. This means that powerful evacuation force is required to apply adequate suction pressure to the entire bottom surface of the wafer. The use of such evacuation force, however, results in deformation of the wafer. This problem is especially significant with thin wafers.

The deformation of the wafer occurring when the wafer is attached to the stage by high suction pressure is caused, e.g., by foreign matter caught between the stage and the wafer. In order to prevent deformation of the wafer due to the presence of such foreign matter, it is necessary to attach a conductive sheet to the bottom surface of the wafer. This, however, results in increased cost.

One method for avoiding this problem is to reduce the evacuation pressure (or vacuum pressure) of the evacuation pump, which, however, reduces the degree of adhesion between the wafer and the stage. A reduction in the degree of adhesion between the wafer and the stage causes problems such as increased contact resistance between them when the stage is used as an electrode.

SUMMARY OF THE INVENTION

The present invention has been made to solve the above problems. It is, therefore, an object of the present invention to provide a wafer suction method, a wafer suction stage, and a wafer suction system capable of attaching a wafer to a stage by application of adequate suction pressure to the wafer in a low cost manner without deformation of the wafer.

The features and advantages of the present invention may be summarized as follows.

According to one aspect of the present invention, a method of attaching a wafer by suction includes in order, a step of mounting a wafer on a right arm and a left arm of a transfer jig having a shaft portion, the right and left arms extending in the same direction and being connected to each other through the shaft portion, a transfer step of moving the transfer jig toward a wafer suction stage in such a manner that a facing right arm surface of the right arm slides along and in contact with a first side surface of the wafer suction stage and a facing left arm surface of the left arm slides along and in contact with a second side surface of the wafer suction stage until the wafer comes to lie directly above a mounting surface of the wafer suction stage, wherein the facing right arm surface faces the left arm and the facing left arm surface faces the right arm, and wherein the second side surface of the wafer suction stage is formed on the opposite side of the wafer suction stage from the first side surface, a mounting step of mounting the wafer on the mounting surface by moving the transfer jig downward toward the wafer suction stage while maintaining the facing right arm surface in contact with the first side surface and the facing left arm surface in contact with the second side surface, and a step of attaching the wafer to the mounting surface by suction.

According to another aspect of the present invention, a wafer suction stage having a space therein, includes a mounting surface for mounting a wafer thereon, a porous section formed in the wafer suction stage and having a top surface exposed at the mounting surface and a bottom surface adjoining the space, and a connection path communicating with the space and extending to an outside of the wafer suction stage. The porous section is formed to decrease in thickness with increasing distance from the connection path.

According to another aspect of the present invention, a wafer suction system having a wafer suction stage and an air suction system, wherein the wafer suction stage has a space therein and includes a mounting surface for mounting a wafer thereon, a porous section formed in the wafer suction stage and having a top surface exposed at the mounting surface and a bottom surface adjoining the space, and a connection path communicating with the space and extending to an outside of the wafer suction stage. The porous section is formed to decrease in thickness with increasing distance from the connection path. The air suction system includes an evacuation pump connected through a regulator to the connection path, and a control unit for obtaining information about the thickness of a wafer to be attached to the wafer suction stage by suction and controlling the regulator so that the thinner the wafer is, the lower is the vacuum pressure in the connection path.

Other and further objects, features and advantages of the invention will appear more fully from the following description.

DETAILED DESCRIPTION OF THE PREFERRED EMBODIMENTS

First Embodiment

Figure 1:
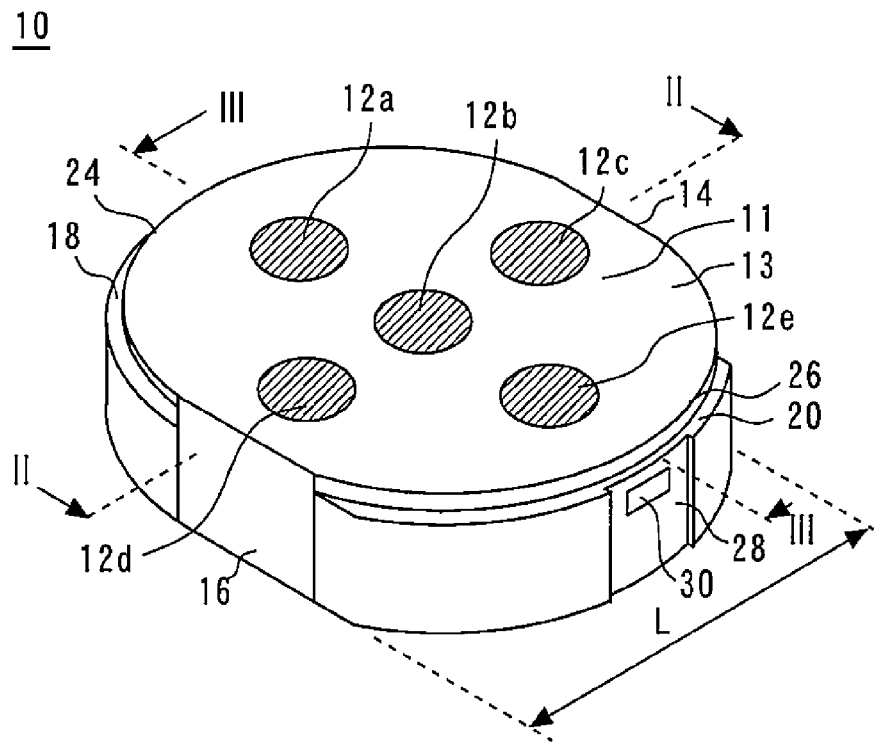
FIG. 1 is a perspective view of a wafer suction stage in accordance with a first embodiment of the present invention.

FIG. 1 is a perspective view of a wafer suction stage in accordance with a first embodiment of the present invention. The wafer suction stage 10 has a mounting surface 11 for mounting a wafer thereon. The mounting surface 11 has a plurality of porous sections 12a, 12b, 12c, 12d, and 12e formed therein. The porous section 12b is disposed at the center of the mounting surface 11, and the porous sections 12a, 12c, 12d, and 12e are disposed to surround the porous section 12b. A metal section 13 surrounds the porous sections 12a, 12b, 12c, 12d, and 12e. The metal section 13 and the porous sections 12a, 12b, 12c, 12d, and 12e together form the mounting surface 11.

The porous sections 12a, 12b, 12c, 12d, and 12e are formed of aluminum. In this example, the fine holes of these porous sections have a diameter of 10 μm. However, the diameter of these fine holes can be 10 μm or less.

The wafer suction stage 10 has formed thereon a first side surface 14 and a second side surface 16 opposite to the first side surface 14. The first side surface 14 and the second side surface 16 are separated by a distance L. The sidewalls of the wafer suction stage 10, except for the first side surface 14 and the second side surface 16, are formed of curved surfaces. One of these curved sidewalls have a recessed portion 28 formed therein. A stage electrical contact 30 is formed in the recessed portion 28.

Recessed portions 18 and 20 are formed in outer circumferential edges of the wafer suction stage 10 so as to surround the mounting surface 11, with the recessed portions 18 and 20 having a top surface which is lower than the mounting surface 11. As viewed in plan, the recessed portion 18 extends outwardly from an edge 24 of the mounting surface 11, and the recessed portion 20 extends outwardly from an edge 26 of the mounting surface 11.

Figure 2:
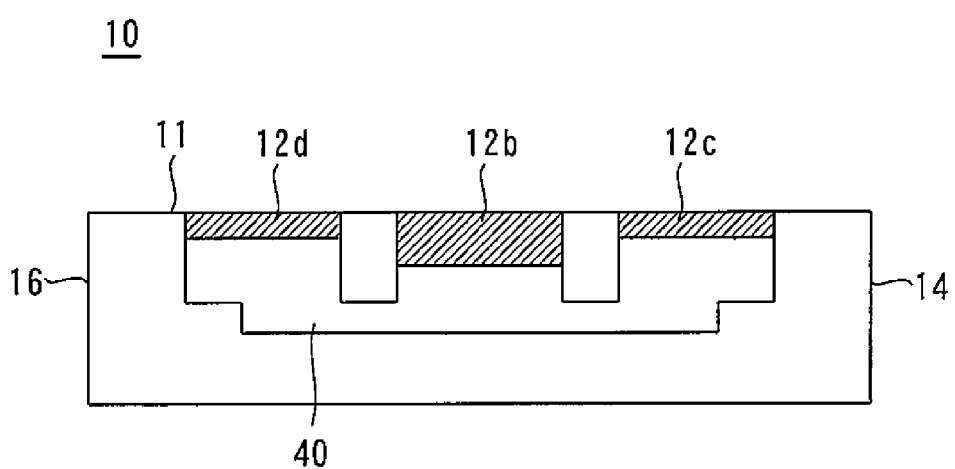
FIG. 2 is a cross-sectional view taken along dashed line II-II of FIG. 1.

FIG. 2 is a cross-sectional view taken along dashed line II-II of FIG. 1. A space 40 is formed in the wafer suction stage 10. The porous sections 12b, 12c, and 12d are formed in the wafer suction stage 10 in such a manner that their top surfaces are exposed at the mounting surface 11 and their bottom surfaces adjoin the space 40. The porous sections 12c and 12d are thinner than the porous section 12b.

Figure 3:
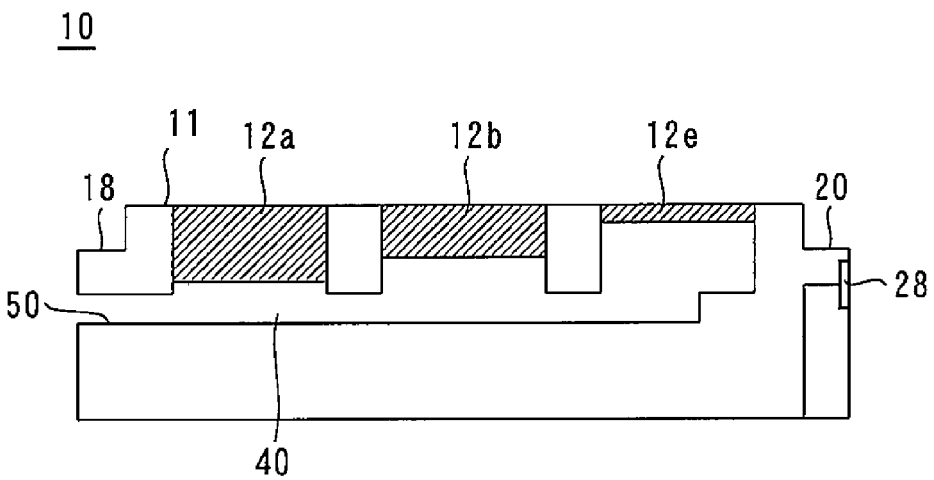
FIG. 3 is a cross-sectional view taken along dashed line of FIG. 1.

FIG. 3 is a cross-sectional view taken along dashed line III-III of FIG. 1. The porous sections 12a, 12b, and 12e are formed in the wafer suction stage 10 in such a manner that their top surfaces are exposed at the mounting surface 11 and their bottom surfaces adjoin the space 40. The porous section 12b is thinner than the porous section 12a, and the porous section 12e is thinner than the porous section 12b. A connection path 50 is formed in the wafer suction stage 10 in such a manner as to communicate with the space 40 and extend to an outside of the wafer suction stage 10.

The porous sections 12a, 12b, 12c, 12d, and 12e decrease in thickness as they are situated further away from the connection path 50. That is, the porous sections 12c, 12d, and 12e are thinner than the porous sections 12a and 12b, since the porous sections 12c, 12d, and 12e are spaced further from the connection path 50 than the porous sections 12a and 12b. Further, since the porous section 12b is spaced further from the connection path 50 than the porous section 12a, the porous section 12b is thinner than the porous section 12a.

The porous sections 12a, 12b, 12c, 12d, and 12e are formed by metal injection molding (MIM). Specifically, a molding die having formed therein a space adapted to be filled with porous material is mounted on a stage and injected with metal powder. The injected metal powder is then subjected to pressing and sintering processes, thereby forming the porous sections 12a, 12b, 12c, 12d, and 12e integral with the metal section 13.

Figure 4:
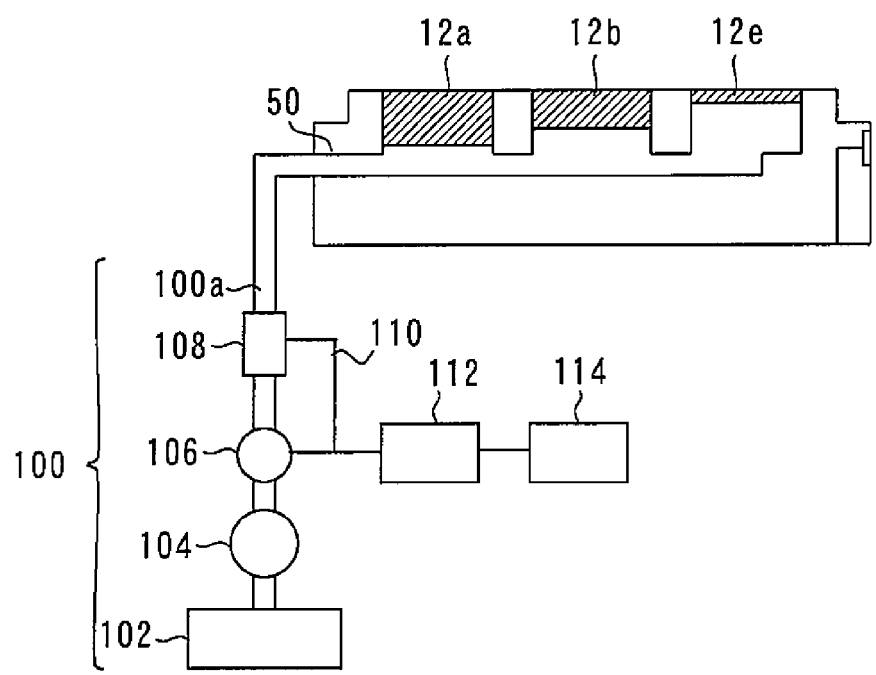
FIG. 4 is a diagram showing a wafer suction system in which an air suction system is connected to the wafer suction stage.

FIG. 4 is a diagram showing a wafer suction system in which an air suction system is connected to the wafer suction stage. The air suction system 100 includes an evacuation pump 102. The evacuation pump 102 is connected to the connection path 50 through a first regulator 104, a second regulator 106, and a pressure sensor 108 by means of piping 100a.

A control unit 112 is connected to the second regulator 106 and the pressure sensor 108 by means of wiring 110. Further, an input unit 114 is connected to the control unit 112. The control unit 112 obtains, from the input unit 114, information about the thickness of the wafer to be attached to the wafer suction stage 10 by suction, and controls the second regulator 106 so that the thinner the wafer is, the lower is the vacuum pressure in the connection path 50.

Figure 5:
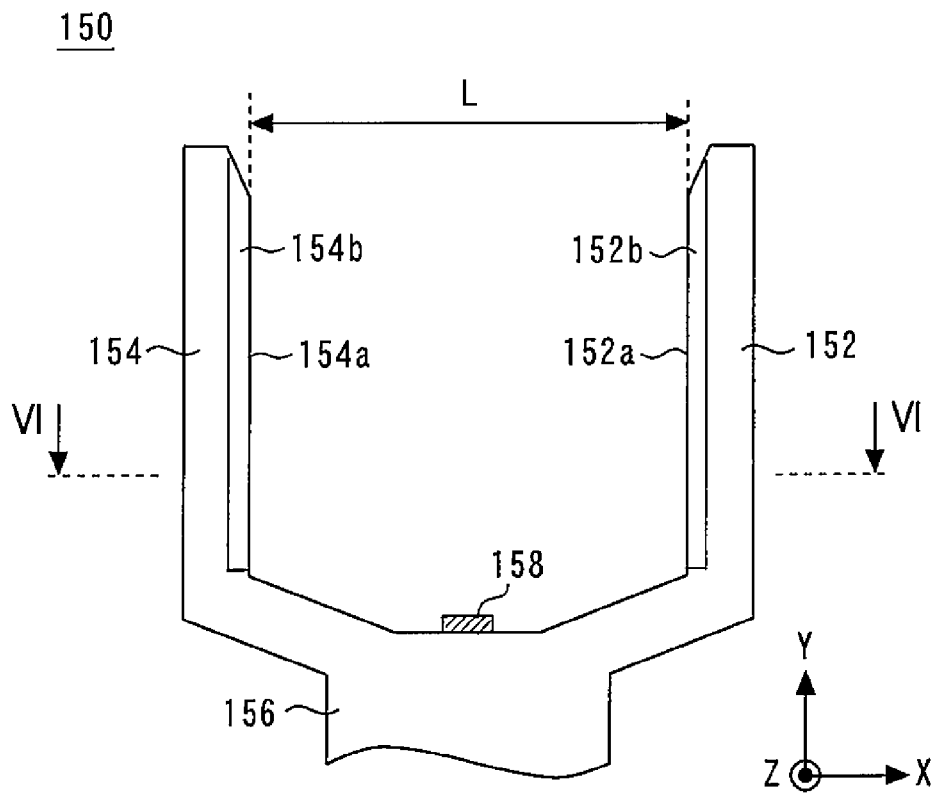
FIG. 5 is a plan view of a transfer jig for transferring a wafer.

FIG. 5 is a plan view of a transfer jig for transferring a wafer. The transfer jig 150 has a right arm 152 and a left arm 154 extending in the same direction as the right arm 152. The surface of the right arm 152 facing the left arm 154 is referred to herein as the facing right arm surface 152a. The surface of the left arm 154 facing the right arm 152 is referred to herein as the facing left arm surface 154a. A countersunk portion 152b is formed in the right arm 152, and a countersunk portion 154b is formed in the left arm 154.

The facing right arm surface 152a and the facing left arm surface 154a are separated by a distance L. The right arm 152 and the left arm 154 are connected to each other through a shaft portion 156. A second electrical contact 158 is formed on the shaft portion 156 and projects outwardly therefrom.

Figure 6:
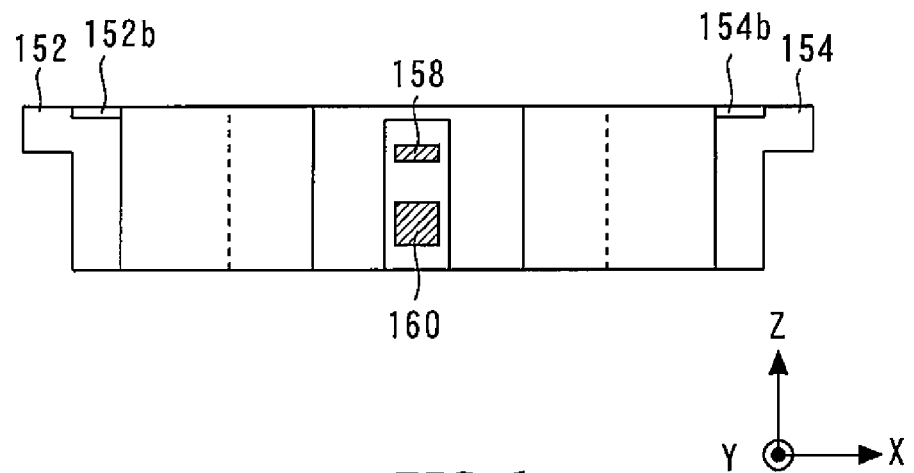
FIG. 6 is a front view of the transfer jig.

FIG. 6 is a front view of the transfer jig. A first electrical contact 160 is formed on the transfer jig. The second electrical contact 158 described above is formed above the first electrical contact 160. A method of attaching a wafer by suction in accordance with the first embodiment will now be described.

Figure 7:
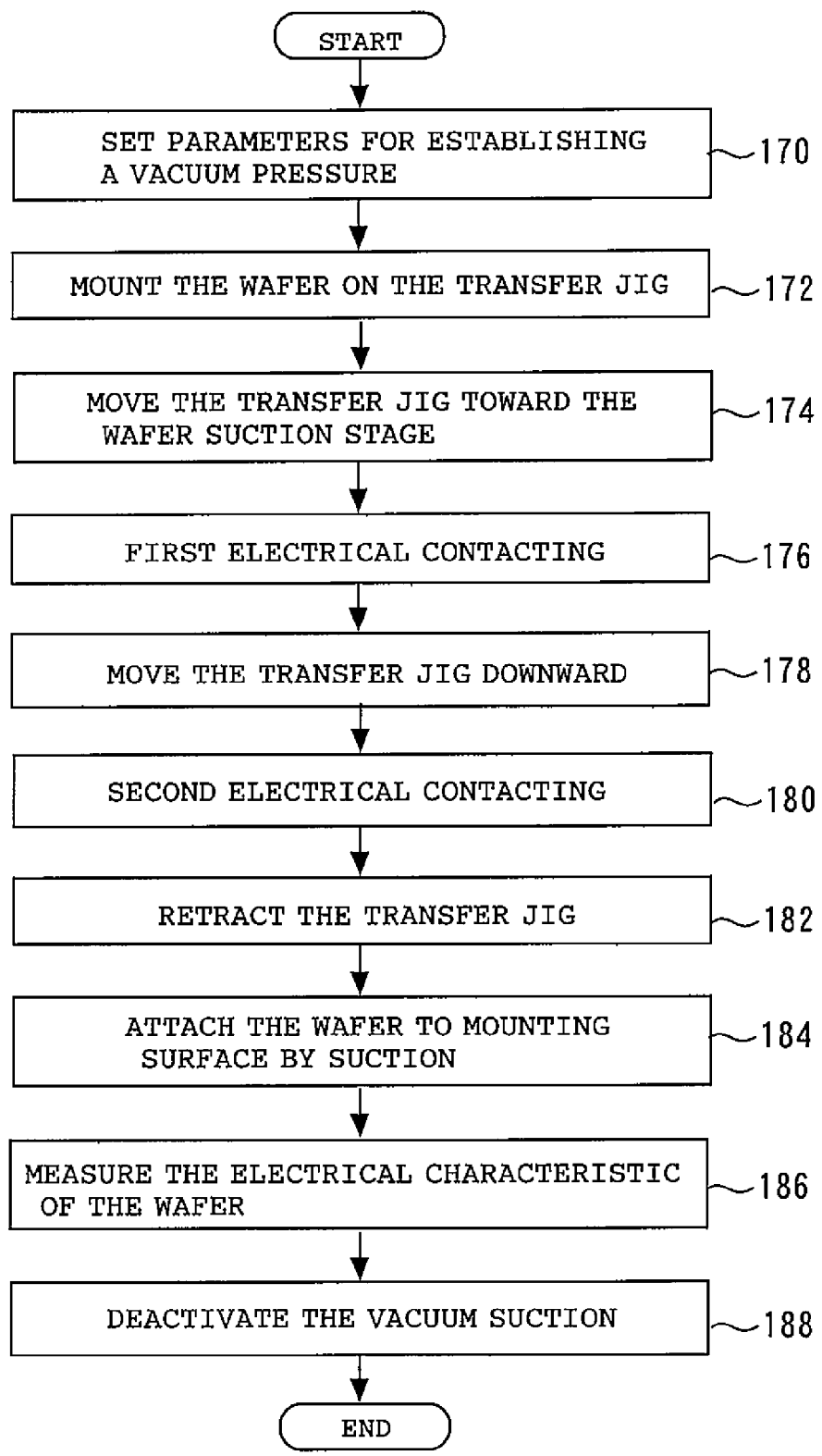
FIG. 7 is a flowchart showing the method of attaching a wafer by suction in accordance with the first embodiment.

FIG. 7 is a flowchart showing the method of attaching a wafer by suction in accordance with the first embodiment. The method begins when the control unit 112 obtains, from the input unit 114, information about the thickness of the wafer to be attached to the wafer suction stage 10 by suction (step 170). After obtaining the information, the control unit 112 sets parameters for establishing a vacuum pressure corresponding to the thickness of the wafer. Specifically, the control unit 112 sets these parameters so that the thinner the wafer is, the lower is the vacuum pressure in the connection path 50.

Figure 8:
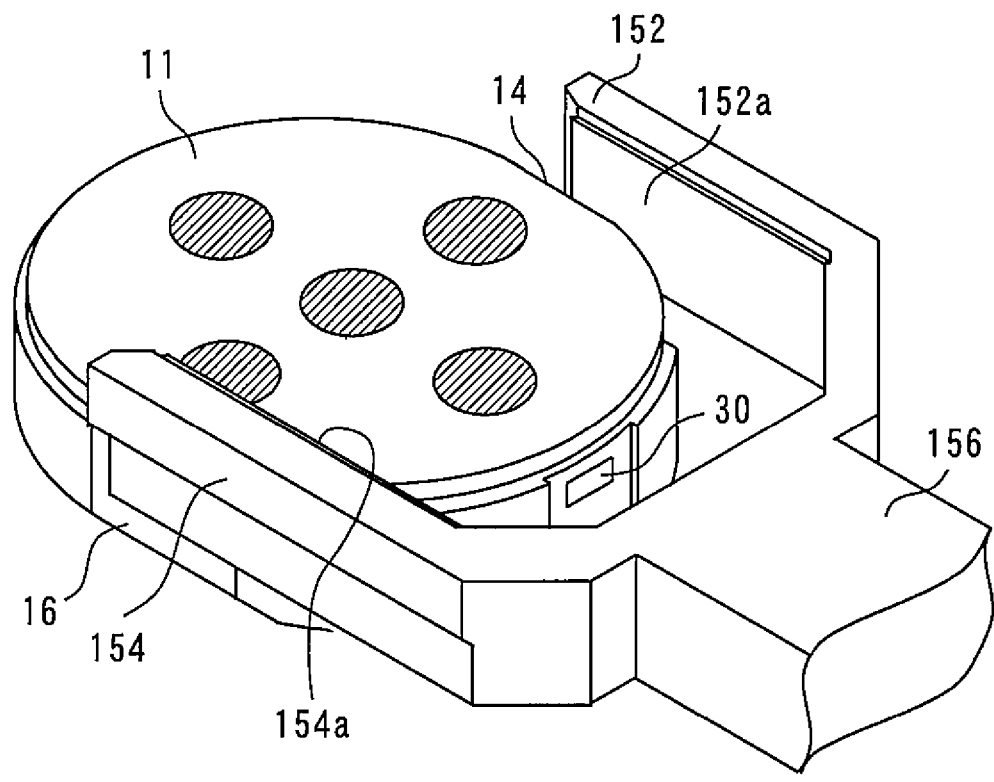
FIG. 8 is a perspective view illustrating the transfer step.

Next, the wafer is mounted on the right and left arms of the transfer jig 150 (step 172). Specifically, the wafer is mounted on the countersunk portions 152b and 154b of the jig 150. The transfer jig 150 is then moved in the Y direction toward the wafer suction stage 10 (step 174). This step is referred to herein as the transfer step. FIG. 8 is a perspective view illustrating the transfer step. The wafer mounted on the right arm 152 and the left arm 154 is omitted from FIG. 8 for convenience of illustration. In the transfer step, the transfer jig 150 is moved toward the wafer suction stage 10 in such a manner that the facing right arm surface 152a slides along and in contact with the first side surface 14 and the facing left arm surface 154a slides along and in contact with the second side surface 16 until the wafer comes to lie directly above the mounting surface 11 of the wafer suction stage 10.

The transfer step terminates when the first electrical contact 160 of the transfer jig 150 has come into contact with the stage electrical contact 30 of the wafer suction stage 10 as a result of the transfer jig 150 being moved toward the wafer suction stage 10 (step 176). The contacting of the first electrical contact 160 with the stage electrical contact 30 is referred to herein as the first electrical contacting.

The transfer jig 150 is then moved downward, i.e., in the negative Z direction (step 178). This step is referred to herein as the mounting step, since in this step the wafer is mounted on the mounting surface 11. Specifically, in the mounting step, the transfer jig 150 is moved downward toward the wafer suction stage 10 while the facing right arm surface 152a and the facing left arm surface 154a are maintained in contact with the first side surface 14 and the second side surface 16, respectively. This movement of the transfer jig 150 results in the wafer being mounted on the mounting surface 11.

The mounting step terminates when the second electrical contact 158 of the transfer jig 150 has come into contact with the stage electrical contact 30 (step 180). The contacting of the second electrical contact 158 with the stage electrical contact 30 is referred to herein as the second electrical contacting. Thus, the state of contact between these electrical contacts is electrically detected and used to determine whether to move or stop the transfer jig 150. After the mounting step, the transfer jig 150 is retracted (step 182).

Figure 9:
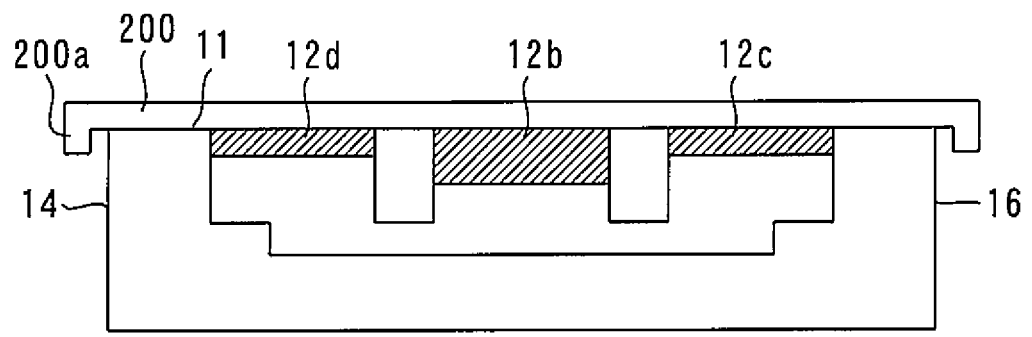
FIG. 9 is cross-sectional view of the wafer mounted on the mounting surface.
Figure 10:
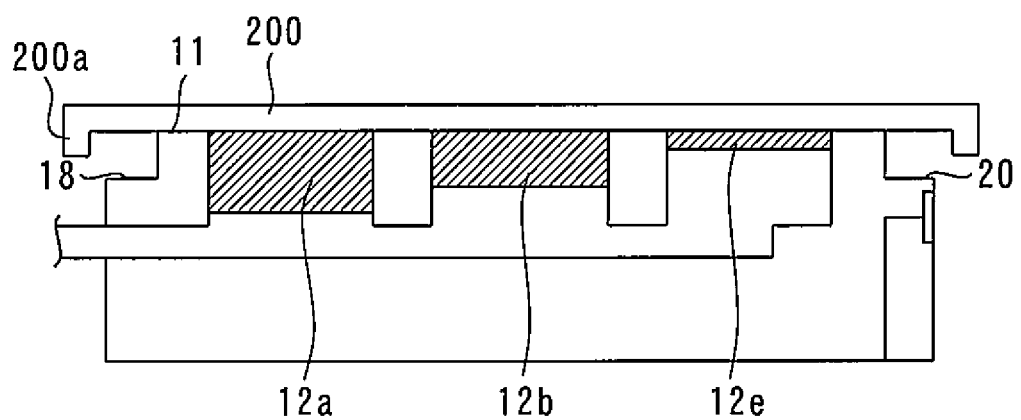
FIG. 10 is cross-sectional view of the wafer mounted on the mounting surface.

FIGS. 9 and 10 are cross-sectional views of the wafer mounted on the mounting surface 11. The wafer 200 has a rim portion 200a along its periphery. If this rim portion 200a comes into contact with the mounting surface 11 when the wafer 200 is mounted on the mounting surface 11, it will prevent surface contact between the wafer and the mounting surface 11. However, in accordance with the first embodiment, the mounting surface 11 is small enough to avoid contact of the rim portion 200a with the mounting surface 11. Specifically, the recessed portions 18 and 20 are provided to prevent contact of the rim portion 200a with the mounting surface 11.

Next, the wafer is attached to the mounting surface 11 by suction (step 184). At that time, the control unit 112 controls the second regulator 106 based on the parameters for establishing the vacuum pressure, which have been set in step 170. Thus, the wafer is attached to the mounting surface 11 by sucking air out of the connection path 50 and the space 40 using the air suction system 100, which is connected to the connection path 50 and disposed outside the wafer suction stage.

The electrical characteristics of the wafer are then measured while the wafer is still attached to the mounting surface 11 by suction (step 186). The wafer has formed therein a plurality of devices having a so-called vertical structure wherein a current flows from the top surface to the bottom surface of the structure. The measurement of the electrical characteristics of the wafer is made using the metal section 13 of the wafer suction stage 10 as an electrode. The vacuum suction is then deactivated and the wafer is removed from the mounting surface 11, thus ending the process (step 188).

In the method of attaching a wafer by suction in accordance with the first embodiment, suction pressure can be applied substantially equally over the entire bottom surface of the wafer. Specifically, since the porous sections 12a, 12b, 12c, 12d, and 12e decrease in thickness as they are situated further away from the connection path 50, these porous sections apply substantially equal suction pressures to the bottom surface of the wafer so as to attach the wafer to the mounting surface 11. Further, since one of the porous sections (namely, the porous section 12b) is surrounded by the other porous sections, the suction force can be substantially equalized over the bottom surface of the wafer. That is, the vacuum conductances can be substantially equalized.

Further, in order to apply suction pressure substantially equally over the entire bottom surface of the wafer, it is important to accurately position the wafer at a predetermined location on the mounting surface. In accordance with the first embodiment, the wafer can be accurately positioned at a predetermined location on the mounting surface 11, since the wafer is mounted on the mounting surface 11 by moving the transfer jig 150 along and in contact with the wafer suction stage 10.

Thus, in accordance with the first embodiment, suction pressure is applied substantially equally over the entire bottom surface of the wafer, eliminating the need for powerful evacuation force. That is, the contact resistance between the wafer and the wafer suction stage can be adequately reduced merely by applying minimal suction pressure to the wafer. Therefore, the wafer can be attached to the stage by adequate suction pressure without deformation of the wafer which might result if powerful evacuation force were used. It should be noted that another advantage of the wafer being accurately positioned at a predetermined location on the mounting surface 11 is that the rim portion 200a of the wafer is prevented from coming into contact with the mounting surface 11.

Further, the control unit 112 controls the suction pressure so that the thinner the wafer is, the lower is the suction pressure, making it possible to avoid application of excessive suction pressure to a thin wafer which might result in difficulty in detaching the wafer from the mounting surface, or result in deformation of the wafer. Further, in accordance with the present invention, since the suction pressure applied to the wafer is low, there is no possibility of the wafer being deformed by foreign matter (if any) between the wafer and the mounting surface. Therefore, there is no need for a conductive sheet to be formed on the bottom of the wafer, resulting in reduced process cost.

The thin holes of the porous sections 12a, 12b, 12c, 12d, and 12e have a diameter of no more than 10 μm, thereby avoiding deformation of the wafer which would otherwise occur when a probe is pressed against the surface of the wafer. It should be noted that the present invention is not limited to any particular number of porous sections or any particular configuration thereof as long as suction pressure can be applied substantially equally over the entire bottom surface of the wafer.

The material of the porous sections 12a, 12b, 12c, 12d, and 12e is not limited to aluminum, but may be titanium, zinc, iron, cobalt, nickel, tin, copper, silver, rhodium, palladium, platinum, or gold, or a compound or multilayer structure thereof.

Although in the present embodiment the control of the movement of the transfer jig 150 is accomplished by use of electrical contacts, etc., it is to be understood that other methods may be used to control the movement of the transfer jig 150. The evacuation pump 102 may be one which is installed in a factory, etc. and used to evacuate air from a plurality of devices or facilities collectively. In such cases there is a possibility that the evacuation force may fluctuate. In order to prevent this from happening, the first regulator 104 may be used to stably adjust the degree of vacuum to an intermediate value and then the second regulator 106 may be used to stably adjust the degree of vacuum to the desired lower value.

Although in the first embodiment a wafer is attached to the mounting surface by suction for the purpose of measuring the electrical characteristics of the wafer, it is to be understood that the present invention is not limited to this particular purpose. For example, the wafer suction technique of the first embodiment may be used when processing a wafer. Although in the wafer suction method of the first embodiment a wafer is mounted on the mounting surface of the stage by use of the transfer jig 150, it is to be understood that the wafer may be mounted on the mounting surface manually without using the transfer jig 150. However, the use of the transfer jig is preferable in order to accurately position the wafer in place.

Second Embodiment

A second embodiment of the present invention provides a wafer suction method, a wafer suction stage, and a wafer suction system which have many features common to the first embodiment. Therefore, the following description of the second embodiment will be limited to the differences from the first embodiment.

Figure 11:
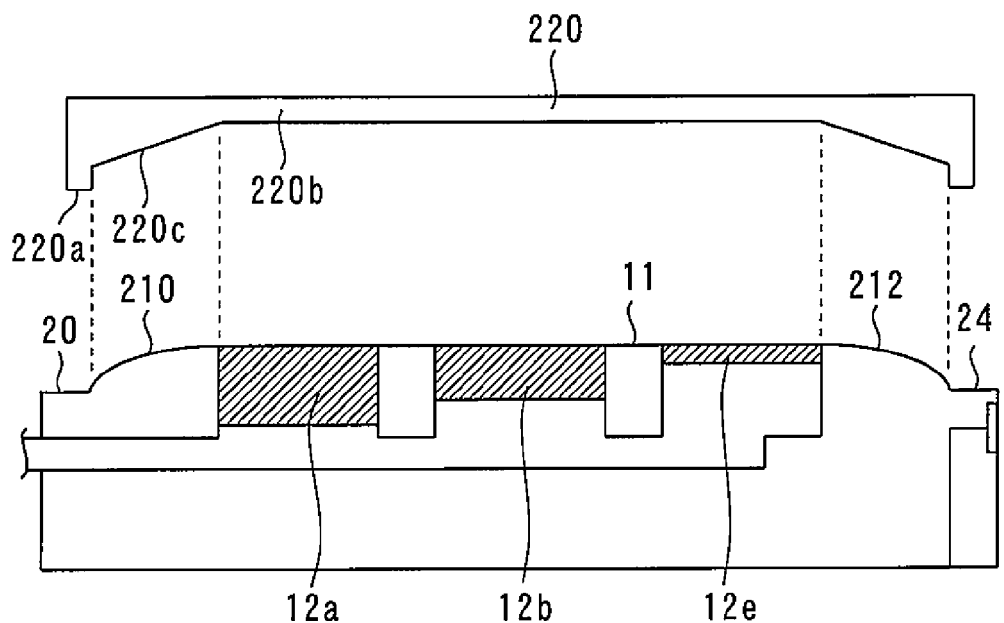
FIG. 11 is a cross-sectional view showing a wafer suction stage, etc. of the second embodiment.

FIG. 11 is a cross-sectional view showing a wafer suction stage, etc. of the second embodiment. A curved surface portion 210 is formed to extend between and connect the mounting surface 11 and the top surface of a recessed portion 20, and a curved surface portion 212 is formed to extend between and connect the mounting surface 11 and the top surface of a recessed portion 24.

Thin wafers having a rim portion (such as the rim portion 200a shown in FIG. 9) typically have a sloped portion at the boundary between the rim portion and the central thin portion of the wafer. FIG. 11 shows such a thin wafer 200, which has a sloped portion 220c at the boundary between a rim portion 220a and a thin portion 220b of the wafer. It has been found in some cases that the sloped portion 220c comes into contact with the mounting surface 11 of the stage thereby warping the wafer. In some cases, this warpage of the wafer has caused strain in the wafer.

The construction of the wafer suction stage of the second embodiment can prevent such warpage of the wafer, since the stage has the curved surface portions 210 and 212 with which the sloped portion 220c comes into contact when the wafer is mounted on the stage. It should be noted that the wafer suction method, the wafer suction stage, and the wafer suction system of the second embodiment are susceptible of alterations at least similar to those that can be made to the first embodiment.

Third Embodiment

A third embodiment of the present invention provides a wafer suction method, a wafer suction stage, and a wafer suction system which have many features common to the first embodiment. Therefore, the following description of the third embodiment will be limited to the differences from the first embodiment.

Figure 12:
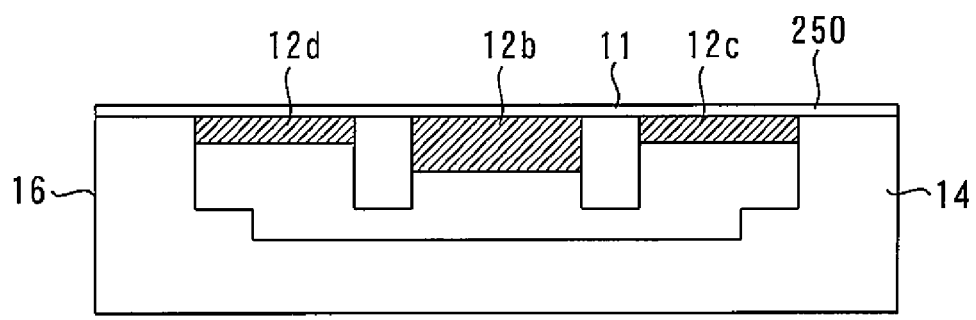
FIG. 12 is a cross-sectional view of the wafer suction stage of the third embodiment.
Figure 13:
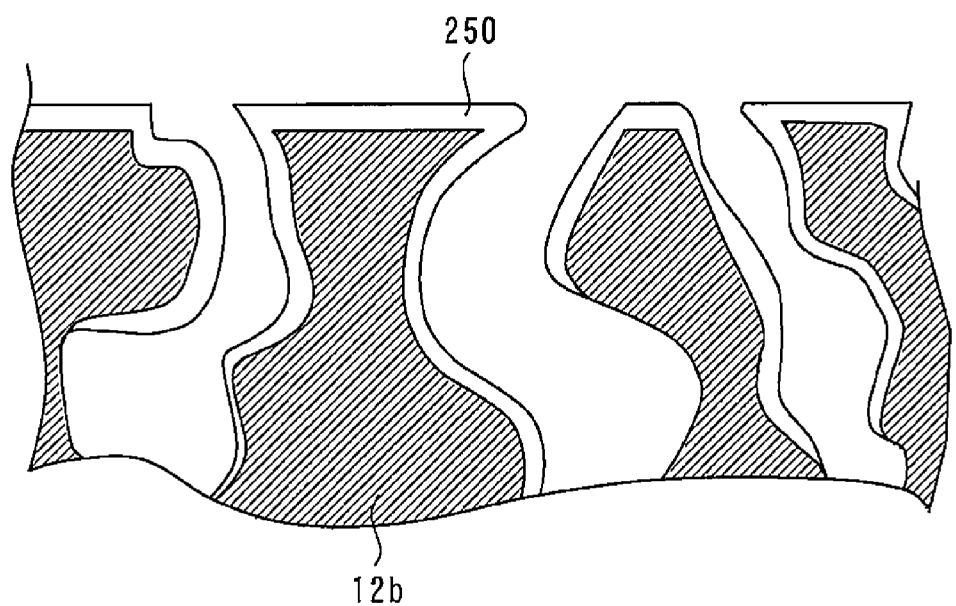
FIG. 13 is a cross-sectional view of the plating formed on one of the porous sections.

The wafer suction stage of the third embodiment is characterized in that a plating 250 is formed on the porous sections 12a, 12b, 12c, 12d, and 12e and the metal section 13. FIG. 12 is a cross-sectional view of the wafer suction stage of the third embodiment. The plating 250 is less than 10 μm thick. FIG. 13 is a cross-sectional view of the plating formed on one of the porous sections. Specifically, the plating 250 is formed on the surface of the porous section 12b without filling the fine holes of the porous section 12b.

Thus in the wafer suction stage of the third embodiment, the plating 250 is formed on the porous sections 12a, 12b, 12c, 12d, and 12e and the metal section 13, thereby increasing the strength of the mounting surface 11. Therefore, it is possible to minimize deformation of the porous sections due to repeated use of the wafer suction stage or due to the presence of foreign matter. Furthermore, since the diameter of the fine holes is 10 μm and the plating 250 is less than 10 μm thick, there is no possibility of these fine holes being filled with the plating 250. Therefore, the formation of the plating 250 on the porous sections enhances the strength of the mounting surface 11 without interfering with the suction of the wafer.

Further, since the plating is formed on the metal section 13 as well as the porous sections 12a, 12b, 12c, 12d, and 12e, the flatness of the mounting surface 11 is maintained. It should be noted that the wafer suction method, the wafer suction stage, and the wafer suction system of the third embodiment are susceptible of alterations at least similar to those that can be made to the first embodiment.

In accordance with the present invention, suction pressure can be applied substantially equally over the entire lower surface of a wafer on a stage, making it possible to attach the wafer to the stage by adequate suction pressure without deforming the wafer.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-071988, filed on Mar. 27, 2012 including specification, claims, drawings and summary, on which the Convention priority of the present application is based, are incorporated herein by reference in its entirety.

What is claimed is:

1. A wafer suction stage having a space therein, comprising:
    a mounting surface for mounting a wafer thereon;
    a porous section formed in a passage of said wafer suction stage and having a top surface exposed at said mounting surface and a bottom surface adjoining said space; and
    a connection path communicating with said space and extending to an outside of said wafer suction stage;
    wherein said porous section is formed to decrease in thickness with increasing distance from said connection path, and
    wherein the thickness is measured in a direction perpendicular to the mounting surface.

2. The wafer suction stage according to claim 1, further comprising a plurality of said porous sections formed therein.

3. The wafer suction stage according to claim 2, wherein said plurality of porous sections are arranged in such a manner that one of said plurality of porous sections is surrounded by the other porous sections.

4. The wafer suction stage according to claim 1, wherein a recessed portion having a top surface lower than said mounting surface is formed in an outer circumferential edge of said wafer suction stage and surrounds said mounting surface.

5. The wafer suction stage according to claim 4, wherein a curved surface portion is formed to extend between and connect said mounting surface and said top surface of said recessed portion.

6. The wafer suction stage according to claim 1, further comprising a plating formed on said top surface of said porous section in such a manner as not to fill fine holes of said porous section.

7. The wafer suction stage according to claim 1, wherein fine holes of said porous section have a diameter of 10 μm or less.

8. The wafer suction stage according to claim 1, wherein the material of said porous section is selected from the group consisting of aluminum, titanium, zinc, iron, cobalt, nickel, tin, copper, silver, rhodium, palladium, platinum, and gold, or a compound or multilayer structure thereof.

9. A wafer suction system having a wafer suction stage and an air suction system, wherein:
   said wafer suction stage has a space therein and comprises a mounting surface for mounting a wafer thereon, a porous section formed in said wafer suction stage and having a top surface exposed at said mounting surface and a bottom surface adjoining said space, and a connection path communicating with said space and extending to an outside of said wafer suction stage;
   said porous section is formed to decrease in thickness with increasing distance from said connection path; and
   said air suction system comprises an evacuation pump connected through a regulator to said connection path, and a control unit for obtaining information about the thickness of a wafer to be attached to said wafer suction stage by suction and controlling said regulator so that the thinner said wafer is, the lower is the vacuum pressure in said connection path.

\* \* \* \* \*